United States Patent [19]

Weber

[11] Patent Number: 4,575,781
[45] Date of Patent: Mar. 11, 1986

[54] PROXIMITY SWITCH

[75] Inventor: Günther Weber, Kollmar, Fed. Rep. of Germany

[73] Assignee: Weber Gesellschaft fur Huttenelektronik mbH, Kollmar, Fed. Rep. of Germany

[21] Appl. No.: 609,210

[22] Filed: May 11, 1984

[30] Foreign Application Priority Data

May 13, 1983 [DE] Fed. Rep. of Germany ....... 3317447

[51] Int. Cl.⁴ .......................... H05K 5/00; H05K 7/00
[52] U.S. Cl. .................................... 361/380; 361/381; 361/417; 361/419
[58] Field of Search ......... 200/158, 304, 305, DIG. 1; 174/16 BH, 16 HS, 52 R, 52 H, 61; 357/74, 81, 82, 84; 361/331, 380–389, 392, 417, 419, 424

[56] References Cited

U.S. PATENT DOCUMENTS 2,798,136  7/1957  Tarbox .............................. 200/158
3,611,046 10/1971  Covert ............................ 361/417 X
3,851,130 11/1974  Paulson .......................... 200/158 X
4,087,666  5/1978  DeHaitre .......................... 200/158
4,103,134  7/1978  Urgero ............................. 200/158
4,403,102  9/1983  Jordan et al. .................. 361/417 X Primary Examiner—J. R. Scott
Attorney, Agent, or Firm—Pearne, Gordon, Sessions, McCoy, Granger & Tilberry

[57] ABSTRACT

A proximity switch has a switching body with a sensing area which is parallel to a mounting base securable to a support area. The sensing area is adjustable longitudinally towards a target area on an axis normal to the sensing area and the support area by being adjustably securable to a longitudinal mounting stud. The stud and switching body may have interengaged threads for adjustment, with the stud rotatable or fixed. The stud also may be substantially smooth, with the switching body adjustable longitudinally by a slotted expansible stud, or by pins engageable with a longitudinal series of holes.

31 Claims, 5 Drawing Figures

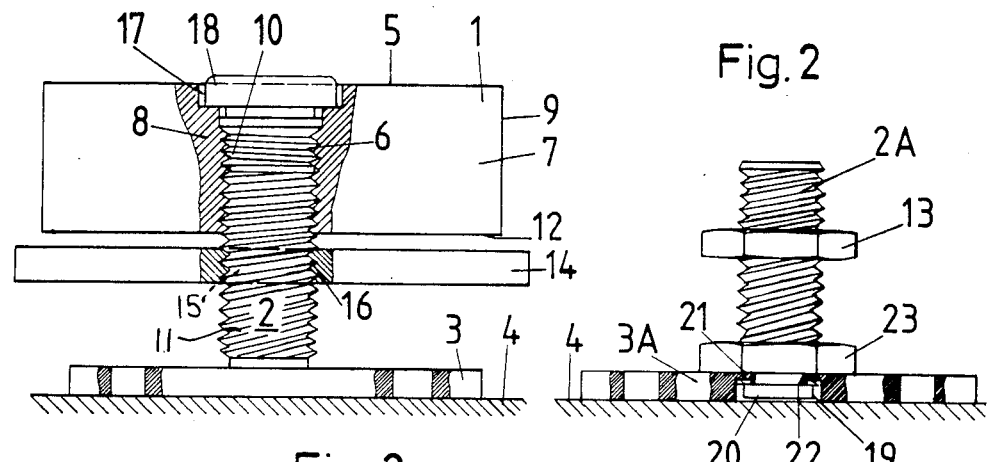
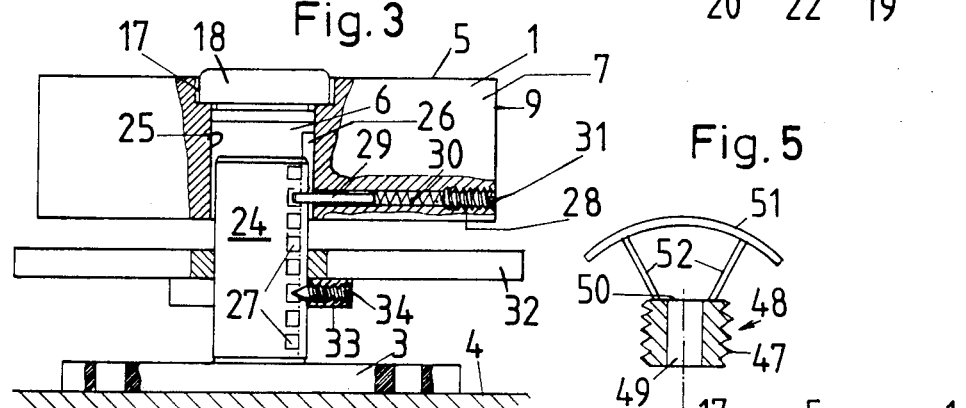
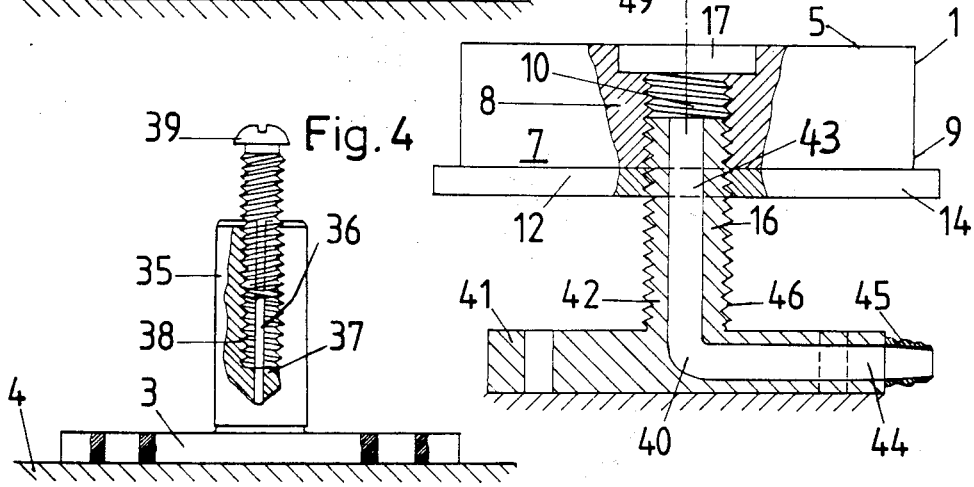

PROXIMITY SWITCH

BACKGROUND OF THE INVENTION

This invention refers to a proximity switch with a switching body that has a sensing area which is parallel to the target area and mounted on a parallel support base.

These kinds of proximity switches find application in increasing numbers in industrial production facilities, especially if they are fully automated and direct contactless switching signals are required. This kind of proximity switch is usually firmly mounted on a support base, and this means that the distance between the sensing area of the proximity switch and the target area in which the object is situated, which triggers a switching signal, is adjusted with potentiometers.

Proximity switches with long sensing ranges are flat in design and this means that the sensing area is larger than the construction height. In a proximity switch mounted on a metallic base, which is usually the case in production facilities, this design has substantial disadvantages. This is based on the fact that the electromagnetic field of the proximity switch is affected by the metallic mounting base. This influence causes problems, e.g., where in a production line the switch is required to sense a different target and the sensing distance needs to be adjusted with a potentiometer accordingly. This adjustment requires specially trained personnel because the electronic adjustment changes not only the switching distance of the proximity switch but the entire switching characteristics, e.g., temperature dependency and switching time. It happens frequently that authorized personnel are not able to adjust the switches correctly and have a tendency to adjust the switches to their maximum switching range, with the result that the switch becomes oversensitive and, with temperature changes, gives misleading signals. This causes down time, especially in fully automated production lines.

There are proximity switches with a fixed switching distance available which are mechanically adjusted towards the targets. However, they have only small sensing ranges. They are long, cylindrical designs of which one circular area is the sensing surface. They are mounted at an angle to the base area or, if sensing must be perpendicular to the base area, they are mounted in a deep hole into the base area. Such a proximity switch is only adjustable to changing operational conditions with substantial mounting and installation alterations.

This invention aims, therefore, to create a proximity switch with the aforementioned features, a switch with long switching range and a minimum of mechanical alterations, adjustable to changing target distances. This task is solved by the invention of mounting at least one mounting stud normal to the base area with its longitudinal axis to the target area on which the sensing body is directionally flexibly mounted between the base area and target area.

The proximity switch of the present invention is built with a fixed switching distance and adjustment takes place mechanically.

The switch has the advantage that it is less sensitive with respect to installation errors. It is also an advantage that the switch can be built in an encapsulated construction which is a protection against dirt and other environmental influences. Furthermore, by means of simple distance measurement, the correct switching distance to the target is easily determined. Shielding discs protect the switch so that at different positions the switching body is without interference caused by the mounting base area, thus preventing switching irregularities.

The adjustment to changing operational conditions can be made with a few simple alterations which even unskilled personnel are able to achieve.

Due to the mechanical adjustment possibility, the electronic adjustment by means of the potentiometer becomes obsolete. This is the practical advantage because maladjustment is no longer possible. There was a tendency, due to a great deal of maladjustment, to ban proximity switches from computer-programmed production processes, and with the present invention this stigma has been positively overcome.

It is a special feature of the invention that the switch can also be applied in locations such as rolling mills because a cooling medium can be filtered through the center recess of the mounting stud, thus providing, even at high ambient temperatures, temperature independency.

Other objects and a fuller understanding of the invention may be had by referring to the following description and claims, taken in conjunction with the accompanying drawing.

BRIEF DESCRIPTION OF THE DRAWING

FIG. 1 is an elevational view, partly in longitudinal section, of a proximity switch with a threaded mounting stud;

FIG. 2 is an elevational view of a mounting base with a rotatable mounting stud;

FIG. 3 is an elevational view, partly in longitudinal section, of a modified proximity switch with retention pin mounting;

FIG. 4 is an elevational view, partly in longitudinal section, of a further mounting base with an adjusting screw; and FIG. 5 is an elevational view, partly in longitudinal section, of a further proximity switch with recess for cooling medium and distribution.

DETAILED DESCRIPTION OF THE PREFERRED EMBODIMENT

A proximity switch consists basically of a switching body 1 containing the switching electronics (not shown) which is fastened on a mounting stud 2 attached to a mounting base 3 which is based on a support area 4. The switching body is preferably of a cylindrical shape, and has opposite the mounting base area a sensing area 5 which is situated parallel to the support area 4. The sensing area 5 is directed to a target within the sensing range, and when the target moves into the sensing range, this triggers the switching signal. The switching body 1 has a sleeve 8 and a coaxial housing 9 together defining an inner space 7 for the switching electronics. The housing may be molded onto the sleeve. In this embodiment, the sleeve has a female thread 10 which matches the external thread 11 of the mounting stud 2. A recess 6 is established beneath a cover 18, above the mounting stud 2 and within the sleeve 8. The mounting stud penetrates at least partially through the recess 6 of the switching body 1.

The switching body 1 has a base area 12 parallel to and facing the mounting base 4 on which the switching body 1 is supported on the mounting stud 2 by means of a counter nut 13, shown in FIG. 2.

The counter nut 13 is preferably designed as a counter disc 14, and the counter disc should extend radially beyond the base area 12. The counter disc 14 has a central hole 15 with an inner thread 16 which also matches the outer thread 11. The counter disc 14 is preferably metal, thus shielding the proximity switch from electromagnetic interference which can occur if the support area 4 is metal.

The sleeve 8 has on the sensing area side a cylindrical recess 17 for which the cover 18 is fitted for protection of the proximity switch, thus preventing dirt penetration into the recess 6.

FIG. 2 illustrates another construction of the invention utilizing a rotatable mounting stud 2A located on the mounting base 3A. The mounting base has a basically cylindrical shaped recess 19 adjacent the support area 4 and a constriction 21 so as to capture the head 20 of the mounting stud 2A, yet permit its rotation. Stud 2A has a groove 22 radially adjacent the constriction 21. A lock nut 23 threaded on the stud 2A can secure the stud to the mounting base 3A.

The lock nut 23 can, by means of a spanner, be loosened so that turning the mounting stud 2A in the mounting base 3 fixes the switching body 1 onto the mounting stud 2A, due to the matching threads 10, 11. This feature prevents the switching body from rotation, which has the advantage that the electrical connection of the proximity switch does not have to be disconnected when the switching distance must be adjusted. When the switching body 1 is in the correct position and the sensing area 5 is adjusted to the new condition, the switching body is locked by means of counter nut 13 or counter disc 14 tightened against the base area 12 of the switching body 1.

FIG. 3 illustrates another embodiment of the invention of a basically smooth kind of mounting stud 24 which is surrounded by a smooth sleeve 25 of the switching body. The mounting stud has, preferably in a longitudinal direction, a guide key 26 slidable in a longitudinal keyway. The mounting stud 24 is equipped with pocket holes 27 in series and closely adjacent to each other. Drilled into the switching body 1, preferably close and parallel to the base area 12, is a hole 28 in which a retention pin 29 is placed, which, by means of a spring 30, can be locked into the pocket hole. The spring rests on the opposite side facing the retention pin on a pilot screw 31, which is screwed into threads in the hole 28.

This construction of the invention features the possibility that the switching body 1 is adjustable in an up and down direction on the mounting stud 24 into or away from the support area 4. The switching body can be locked by means of retention pins 29 into the pocket holes 27. The various adjustment possibilities are defined by the number of pocket holes and retention pins and spaces between them. It is also possible to use, instead of retention pin 29, spring 30, and pilot screw 31, a grub screw which penetrates through the drilled hole 28 and locks itself, with its part facing the mounting stud, into the pocket holes situated in the fixing bolt. In this construction, it is possible to eliminate the guide key 26 and pocket holes 27 because a grub screw is able to lock itself onto the smooth mounting stud 24, thus supporting the switching body 1. On its side facing the support area 4, the switching body 1 is equipped with a shielding disc 32 which is placed parallel to the sensing area 5 of the switching body 1 and extends radially beyond the switching body. The shielding disc 32 is either tightly connected with the switching body 1 or has on its side opposite the switching body a locking disc 33 which is penetrated by a pin 34 directed to a pocket hole. The pin 34 can also be a grub screw locking itself into a pocket hole or tightened against the smooth surface of the mounting stud 24.

FIG. 4 illustrates a further construction variety of the invention wherein the mounting stud 35 has a smooth surface, and on which also a smooth sleeve of the switching body 1 is fitted. The mounting stud 35 has at least one longitudinal slot 36 extending to a central aperture 37 which is equipped with an inner thread 38. A clamping screw 39, which has a slightly larger diameter than the inner thread 38, may be screwed into the threads 38, so that when the clamping screw is inserted, the slot expands and the mounting stud 35 and the sleeve of the switching body 1 are clamped tightly together. This construction version of the invention allows also for attachment of a shielding disc directly to the switching body 1 or attachment by means of clamping screw 39. Instead of insertion of clamping screw 39 into thread 38, it is also possible to make a smooth drilling 37 and use a clamping cone drawn to spread the slot 36 by the clamping screw 39.

FIG. 5 illustrates another construction of the invention in providing the proximity switch with cooling media supply 40, preferably cooling water. On a mounting base 41 a mounting stud 42 is attached, which has the total length penetrated by a coolant aperture 43 which is connected to a cooling medium tube 44 located in the mounting base 41 situated parallel to the support area 4 with recommended hose connection 45. It is also possible to apply to the mounting base 3 of FIGS. 1–4 a hose connection which is located on that side of the mounting base facing the support area 4, thus penetrating through the support area 4.

The mounting stud 42 has on its outside a thread 46 which matches the inner thread 10, 16 of the recess in the sleeve 8 and counter disc 14 of the switching body 1. To the inner thread 10 of the switching body 1 is an outer thread 47 applied to a screw insert 48 which is preferably shaped as a short pipe with inner central aperture 49. This screw insert 48 is screwed into the inner thread 10 of the sleeve 8 so that the central aperture 49 connects with the coolant aperture 43 in stud 42. At the opposite side of the aperture 49 of the screw insert 48 is an exit 50 for the cooling medium, directed towards a deflector plate 51. The deflector plate 51 is an umbrella-shaped screen with fixed links 52 to the screw insert 48 in the area of the cooling medium exit 50.

With this construction of the invention, it is possible to apply proximity switches also in areas of production facilities with high temperatures, because a constant flow of cooling medium supply 40, preferably cooling water, may flow over the entire switching body 1, thus protecting the unit from destruction and functional changes due to high temperatures. The cooling medium exits from exit 50, distributing a regular consistent film over the entire switching body 1.

The present disclosure includes that contained in the appended claims, as well as that of the foregoing description. Although this invention has been described in its preferred form with a certain degree of particularity, it is understood that the present disclosure of the preferred form has been made only by way of example and that numerous changes in the details of construction and the combination and arrangement of parts may be resorted to without departing from the spirit and the scope of the invention as hereinafter claimed.

What is claimed is:

1. A mounting for a proximity switch with a switching body which has a target area-directed sensing area normal to a central recess, said mounting comprising, in combination: a mounting stud erected with its longitudinal axis directed normal to the target area and normal to a support area for said stud, and on which the switching body is longitudinally adjustable at said central recess relative to the target area; and means to secure the switching body in adjusted longitudinal position on said mounting stud.

2. A proximity switch mounting according to claim 1, defined by said mounting stud which partially penetrates the recess in the switching body.

3. A proximity switch mounting according to claim 1, defined by central penetration of said mounting stud through the central recess of said switching body.

4. A proximity switch mounting according to claim 1, defined by a sleeve of the switching body which radially defines the central recess and surrounds the mounting stud.

5. A proximity switch mounting according to claim 3, defined by an external thread on said mounting stud and a matching female thread in said central recess.

6. A proximity switch mounting according to claim 5, defined by a self-locking thread.

7. A proximity switch mounting according to claim 1, defined by a mounting base; and means to secure said mounting base to the support area and to said mounting stud.

8. A proximity switch mounting according to claim 7, defined by a rigid connection of said mounting stud to said mounting base.

9. A proximity switch mounting according to claim 7, defined by said mounting stud being rotatably secured on said mounting base.

10. A proximity switch mounting according to claim 5, defined by a counter nut which has a thread matching the external thread of said mounting stud thus providing that the switching body can be secured parallel to the support area.

11. A proximity switch mounting according to claim 5, defined by a counter disc which has a matching thread to fit said external thread of said stud, said counter disc adapted to engage a base area of the switching body to lock the switching body in place, the diameter of said counter disc being larger than said base area.

12. A proximity switch mounting according to claim 1, defined by a base area located on the support area end of said switching body and a sensing area on the opposite end.

13. A proximity switch mounting according to claim 12, defined by a housing of cylindrical shape on said switching body, and a counter disc is radially extended beyond said base area of said switching body.

14. A proximity switch mounting according to claim 13, defined by said counter disc functioning as shielding.

15. A proximity switch mounting according to claim 13, defined by the fact that said counter disc is made of metal.

16. A proximity switch mounting according to claim 1, defined by a longitudinal guide key in the central recess between said mounting stud and said switching body; a longitudinal series of holes in said mounting stud; and retention pins attached to the switching body for the securing of the switching body onto the mounting stud.

17. A proximity switch mounting according to claim 16, defined by a retention pin inserted into a hole in the switching body, the hole fitted with a spring of which the opposite end is retained by a pilot screw.

18. A proximity switch mounting according to claim 16, defined by a grub screw inside the switching body engaging said mounting stud to secure said switching body to said mounting stud.

19. A proximity switch mounting according to claim 1, defined by at least one longitudinal slot in said mounting stud; and means to expand said mounting stud to provide a clamping arrangement to said switching body.

20. A proximity switch mounting according to claim 19, wherein said clamping arrangement is provided by a central penetrating clamping screw inside said mounting stud and having an outer thread larger than an inner thread in said mounting stud.

21. A proximity switch mounting according to claim 19, wherein said clamping arrangement includes a longitudinally sliding conical clamp device to expand said slot.

22. A proximity switch mounting according to claim 1, defined by a base area on the switching body; and an adjacent parallel shielding disc that is radially slightly extended beyond the base area of the switching body.

23. A proximity switch mounting according to claim 22, defined by the fact that the shielding disc is totally locked with the base area of the switching body.

24. A proximity switch mounting according to claim 22, including a locking disc on the side of said shielding disc opposite said base area of the switching body; and a pin in said locking disc engaging said mounting stud.

25. A proximity switch mounting according to claim 1, defined by an aperture through the mounting stud for cooling means.

26. A proximity switch mounting according to claim 25, defined by a cooling means exit at one end of the switching body.

27. A proximity switch mounting according to claim 25, defined by a pipelike screwable device with an outer thread matching an inner thread of the switching body at a cooling means of the central recess exit.

28. A proximity switch mounting according to claim 27, including a deflector plate at said cooling means exit to distribute the cooling means radially over the sensing area of the switching body.

29. A proximity switch mounting according to claim 28, defined by fixed links attaching said deflector plate to said screwable device.

30. A proximity switch mounting according to claim 28, defined by said deflector plate being umbrella-shaped.

31. A proximity switch mounting according to claim 1, defined by a cover locking into the central recess of the switching body at the sensing area.

* * * * *

UNITED STATES PATENT AND TRADEMARK OFFICE
CERTIFICATE OF CORRECTION

PATENT NO. : 4,575,781
DATED : March 11, 1986
INVENTOR(S) : Gunther Weber

It is certified that error appears in the above-identified patent and that said Letters Patent are hereby corrected as shown below:

Claim 28, line 50, delete "at a cooling means of the central recess exit" and insert --at a cooling means exit of the central recess--.

Signed and Sealed this

Twenty-eighth Day of October, 1986

[SEAL]

Attest:

DONALD J. QUIGG

Attesting Officer     Commissioner of Patents and Trademarks